United States Patent
Hochschild

(10) Patent No.: US 8,223,055 B2
(45) Date of Patent: Jul. 17, 2012

(54) REDUCED-SWITCHING DYNAMIC ELEMENT MATCHING APPARATUS AND METHODS

(75) Inventor: James R. Hochschild, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 89 days.

(21) Appl. No.: 12/940,518

(22) Filed: Nov. 5, 2010

(65) Prior Publication Data

US 2012/0112942 A1    May 10, 2012

(51) Int. Cl.
*H03M 1/66* (2006.01)
(52) U.S. Cl. .................... 341/144; 341/118; 341/143
(58) Field of Classification Search .................. 341/143, 341/144
See application file for complete search history.

(56) References Cited

U.S. PATENT DOCUMENTS

| | | | |
|---|---|---|---|
| 6,426,714 B1 * | 7/2002 | Ruha et al. | 341/143 |
| 6,518,899 B2 * | 2/2003 | Yu | 341/118 |
| 6,522,277 B2 * | 2/2003 | Fujimori et al. | 341/144 |
| 6,535,155 B2 * | 3/2003 | Ruha et al. | 341/144 |
| 6,720,897 B1 * | 4/2004 | Wang | 341/143 |
| 6,937,177 B2 * | 8/2005 | Kwan | 341/144 |
| 7,463,175 B2 * | 12/2008 | Kim | 341/126 |

OTHER PUBLICATIONS

Tao Shui, "Mismatch Shaping for a Current-Mode Multibit Delta-Sigma DAC"; IEEE Journal of Solid State Circuits, vol. 34, No. 3, Mar. 1999; pp. 331-338; USA.

* cited by examiner

*Primary Examiner* — Khai M Nguyen
(74) *Attorney, Agent, or Firm* — John J. Patti; Wade J. Brady, III; Frederick J. Telecky, Jr.

(57) ABSTRACT

Apparatus and methods disclosed herein operate to reducing switching artifacts associated with dynamic element matching by sorting a set of unit elements to establish a priority order of selection of a subset of the set of unit elements to use in a next single-sample integration operation. Sorting is achieved by demoting unit elements during the sorting if a usage value associated with the unit element is greater than or equal to a maximum allowable usage spread parameter value. A unit element is promoted during the sorting if a usage value associated with the unit element is less than the maximum allowable usage spread parameter value and the unit element was used in an immediately previous single-sample integration operation.

20 Claims, 5 Drawing Sheets

REDUCED-SWITCHING DYNAMIC ELEMENT MATCHING APPARATUS AND METHODS

TECHNICAL FIELD

Various embodiments described herein relate to apparatus and methods associated with analog-to-digital and digital-to-analog converters, including structures and techniques related to dynamic element matching in multiple unit element converters.

BACKGROUND INFORMATION

Many analog-to-digital (ADC) and digital-to-analog (DAC) converter architectures use matched components and/or references, including resistors, capacitors, transistors, voltage and current sources, single-bit DACs and the like, hereinafter referred to as unit elements (UEs). (It is noted that, although many examples that follow throughout this specification illustrate DAC architectures, embodiments herein may apply to ADCs, DACs (including DACs internal to an ADC), and other circuits or apparatus. Unless otherwise stated, the terms "converters" and "conversion" shall include both ADCs and DACs.)

Physical variables such as fabrication process variations, temperature gradients across circuits, component aging, and component noise may cause circuit component values to differ from their design values. These variations result in mismatch errors which may cause undesirable artifacts at circuit outputs, including non-linearity and harmonic distortion. Digital dynamic element matching (DEM) structures rearrange mismatched elements by reordering bits of the digital inputs used to select the mismatched elements. Particular reordering sequences may be chosen to randomize output artifacts in predetermined ways in a process referred to as "mismatch shaping."

Consider the following example. A dynamic element matched DAC may be implemented with a thermometer encoder, a vector quantizer including a sorting network and UE selection logic, and a set of internal UE DACs. Output signals from the set of UE DACs are integrated to construct portions of the output waveform. The circuit may be structured such that, at a given point in the conversion process, the output waveform is proportional to the number of UE DACs selected. The greater the number of UE DACs selected at a given point in the conversion process, the larger the magnitude of the output. It is noted that, except for the cases of all DACs selected or no DACs selected, the number of DACs selected is a smaller subset of the set of UE DACs. Each DAC is a "unit element" DAC (that is, a DAC theoretically capable of producing the same output as any of the other internal UE DACs for a given input). Consequently, any subset of UE DACs selected will theoretically result in an output signal of the same magnitude as would be produced using a different subset of the same number of UE DACs.

Data flow through the example circuit may begin with a digital word to be converted appearing at the input to the thermometer encoder. Let us say for example, that the binary word to be converted is four bits wide. The thermometer encoder transforms the four bits of the word to be converted to a 15 line thermometer coded output appearing at the input to the vector quantizer. The vector quantizer randomizes the mapping between the thermometer coded output and the set of UE DACs.

Without the vector quantizer, each active thermometer code output line would always activate the same single-bit DAC. Repeating patterns of mismatch attributable to that particular DAC contribute to the above-described undesirable artifacts. Using DEM, the vector quantizer randomizes the mapping between the thermometer coded signal and the array of UE DACs. The effect is to alter positions of the mismatched UE DACs, in a "virtual" sense, to force the average DAC error due to mismatch of the UEs to be uniform over time.

The sorting network associated with the vector quantizer may be structured to "mismatch shape" the output in a particular way in order to attenuate undesirable artifacts. It is noted that, although a UE DAC was chosen for the example above, DEM may apply to UEs other than DACs, such as resistors, transistors, and the like.

Thus, DEM decreases the undesirable effect of the so-called "static mismatch" artifacts described above. However, DEM results in additional UE switching transitions, each of which causes a small but finite amount of output noise and distortion. The noise and distortion is due to mismatches in the timing of the various UE switching transitions, particularly mismatches between the unselected-to-selected and selected-to unselected switching transitions for a given UE.

SUMMARY OF THE INVENTION

Embodiments herein reduce the number of UE switching transitions and consequently reduce the amount of noise and distortion caused by timing mismatches associated with such transitions. First-order mismatch shaping is performed in an ADC, a DAC, or other converter by keeping track of the number of times each UE of a set of UEs has been selected and by limiting a maximum usage spread across all UEs. Additionally, the embodiments operate to reduce switching noise and distortion by disallowing switching in certain instances while maintaining established limits on the maximum usage spread. Some embodiments introduce dither at various points in the associated circuits in order to spectrally distribute quantizer noise and thereby avoid repetitive tones at circuit outputs. Some embodiments include structures to vary the maximum usage spread in certain situations as appropriate to provide for acceptable signal-to-noise ratios (SNRs) at the outputs.

DETAILED DESCRIPTION

Figure 1:
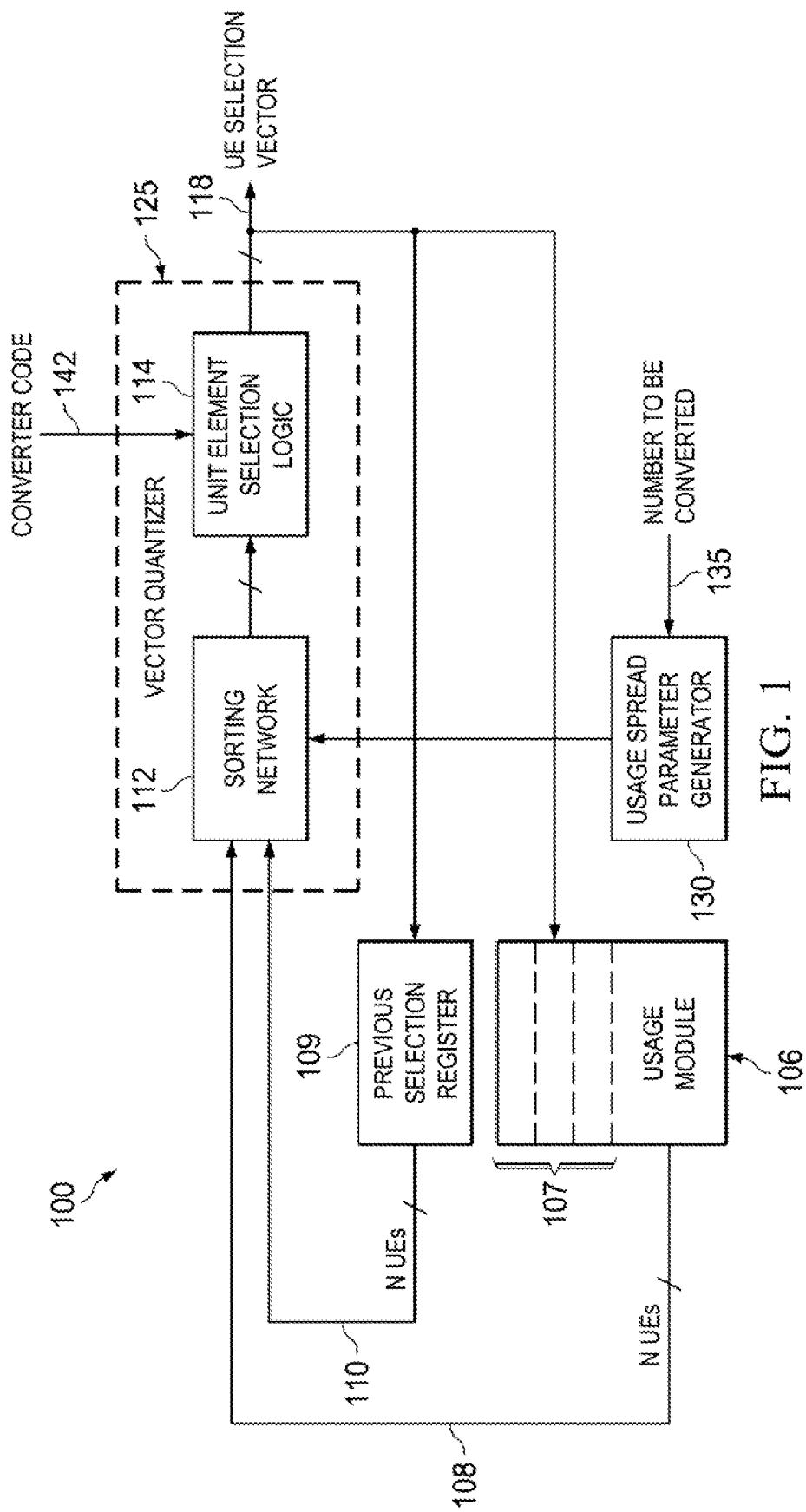
FIG. 1 is a block diagram of a reduced-switching dynamic element matching apparatus according to various example embodiments of the current invention.

FIG. 1 is a block diagram of a reduced-switching DEM apparatus 100 according to various example embodiments of the current invention. In some embodiments, the DEM apparatus may be incorporated into ADC and/or DAC converters. Although example embodiments described below may illustrate DAC architectures, contemplated embodiments may apply to ADCs, DACs, and other circuits or apparatus.

The reduced-switching DEM apparatus 100 includes a usage module 106 to store usage values. In some embodiments, the usage module 106 may include a set of differential counters 107. Each counter stores a usage value for each UE of a set of UEs associated with a converter such as an oversampled DAC. Each usage value represents a count of prior instances of use of a UE adjusted such that the usage value associated with the UE which has been used the fewest number of times is zero. It is noted that some embodiments may be implemented such that the lowest possible usage value is a non-zero number, including perhaps a negative number.

The maximum size of the usage value for any UE is referred to herein as the "maximum allowable usage spread parameter value," V. For example, let us suppose that V=1. In that case, the usage value corresponding to any UE can be either zero or one, and requires a single bit to encode. Using another example, suppose that V=2. In that case, the usage value corresponding to any UE can be zero, one, or two, requiring two bits to encode. Thus, it is a differential count of UE usage that is important to the operation of the DEM of the various embodiments herein rather than an absolute count. Each usage value appears at one of N outputs 108 of the usage module 106, where N is equal to the number of UEs in the set of UEs.

The DEM apparatus 100 also includes a previous selection register 109. The previous selection register 109 stores a previous selection indicator for each UE of the set of UEs. As such, the previous selection register 109 tracks whether a given UE was selected for use in an immediately previous single-sample integration operation. N previous selection indicator states appear at the outputs 110 of the previous selection register 109, one indicator state for each UE of the set of UEs.

The DEM apparatus 100 further includes a sorting network 112 communicatively coupled to the usage module 106 and to the previous selection register 109. The sorting network 112 establishes a priority order of selection of a subset of the set of UEs 108 to use in a next single-sample integration operation. The priority order of selection is based upon the usage values, the previous selection indicators, and V as further described below.

The DEM apparatus 100 also includes UE selection logic 114. The UE selection logic 114 is coupled to the sorting network 112 and translates the priority order of selection obtained by the sorting network 112 to a UE selection vector 118. Together, the sorting network 112 and the UE selection logic 114 perform the function of a vector quantizer 125.

Figure 2:
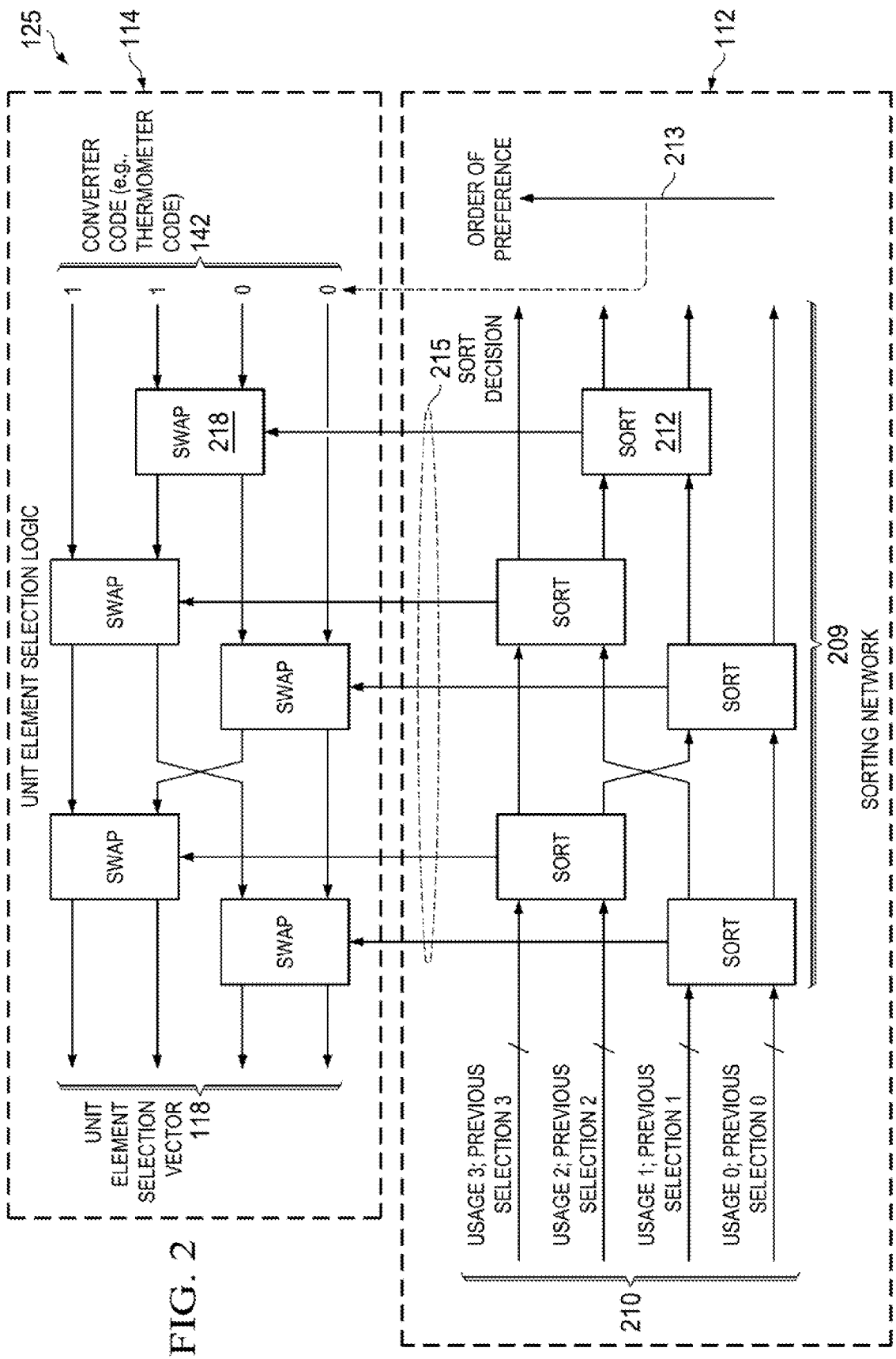
FIG. 2 is a detailed block diagram of a vector quantizer according to various example embodiments.

FIG. 2 is a detailed block diagram of the vector quantizer 125 according to various example embodiments. The vector quantizer 125 includes two sections, the sorting network 112 and the UE selection logic 114, as previously mentioned. In the case of the example vector quantizer 125, the sorting network 112 is implemented using a cascaded series of cross-linked sorting cells 209. The sorting cells 209 perform comparator operations on the usage values and the previous selection indicators 210, as further described below.

In the example embodiment shown in FIG. 2, each sorting cell (e.g., the example sorting cell 212) decides whether to swap or "pass through" a relative priority of usage values and previous selection indicator inputs 210 from an ordered pair of UEs. The decision is based upon the usage values and the states of the previous selection indicator inputs themselves as well as V.

As a result of these sorting network operations, usage and previous selection state information bubble to the top of an order of preference 213 for UEs that are both eligible for use in the next sample operation and were used in the immediately previous sample operation. "Eligible for use in the next sample operation" in this context means that the use of such UE would not exceed V.

The UE selection logic section 114 of the vector quantizer 125 is communicatively coupled to the sorting network 112. Outputs 215 of the sorting cells 209 make up a "sort decision." In some embodiments, each sorting cell of the sorting network 112 is connected to a corresponding swap cell (e.g., the swap cell 218) of the UE selection logic 114, as shown in an example embodiment. The UE selection logic 114 performs a cascaded series of swap cell decisions on bits associated with a current converter code 142 (e.g., a thermometer code) to obtain UE selection vector 118. Each swap cell decision made within the UE selection logic 114 is controlled by a swap decision associated with a corresponding sorting cell of the sorting network 112. It is noted that other implementations of the UE selection logic 114 are possible and are comprehended herein.

Figure 3:
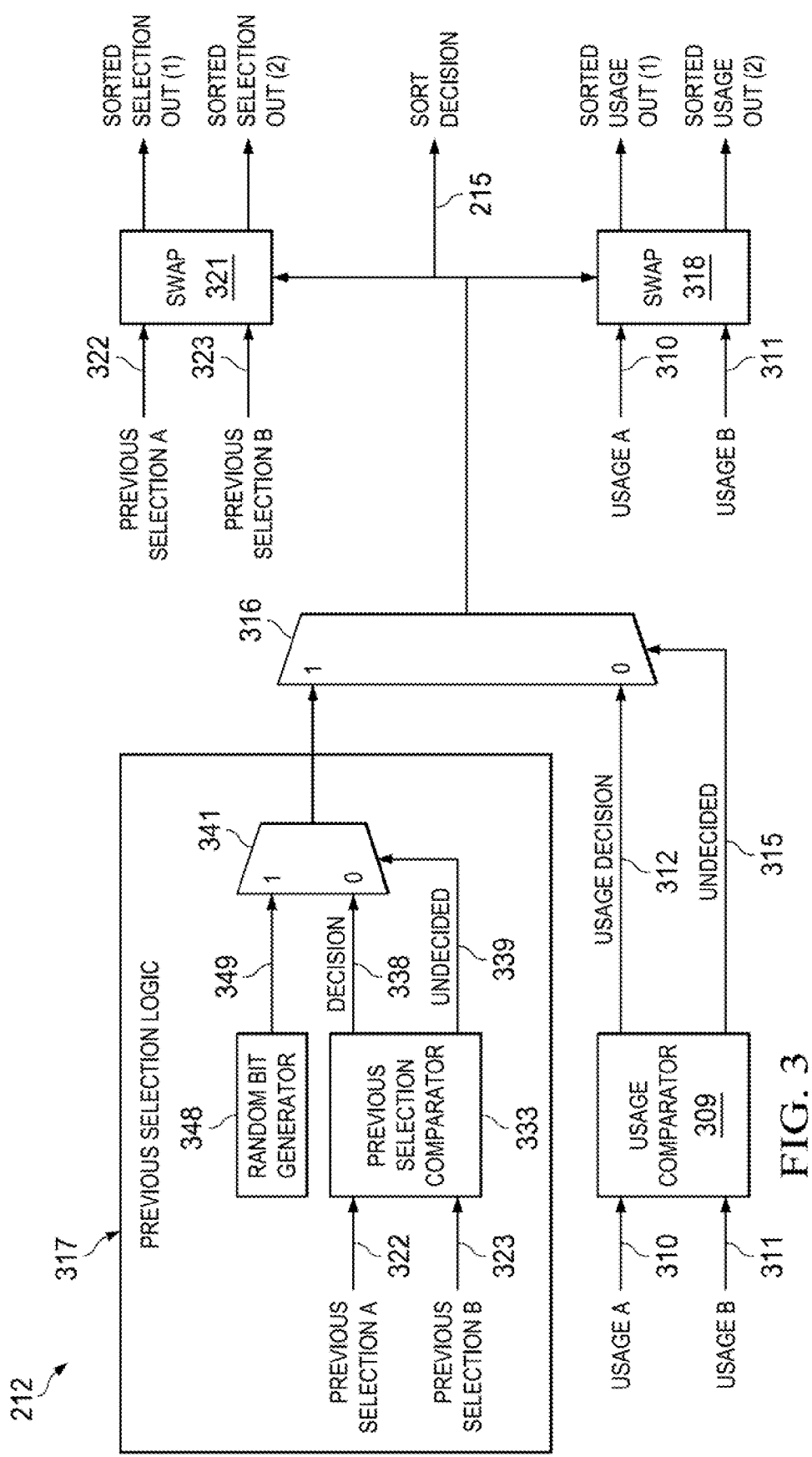
FIG. 3 is a detailed block diagram of an example sorting cell according to various embodiments.

FIG. 3 is a detailed block diagram of the example sorting cell 212 of FIG. 2 according to various embodiments. As previously mentioned, the example sorting cell 212 decides whether to swap or "pass through" relative priorities of usage values and previous selection indicator inputs associated with an ordered pair of UEs based upon the usage values, states of the previous selection indicator inputs, and V. It is noted that in some embodiments, each sorting cell may receive usage values and previous selection indicator inputs from a number of UEs other than two.

Alternative embodiments using logic other than the following example logic to accomplish these objectives are contemplated by and incorporated into this Detailed Specification. For example, circuits utilizing "zero true" or "low true" logic are disclosed herein as are circuits utilizing "one true" or "high true" logic. Likewise, the use of alternative components achieving the same objectives is contemplated and incorporated herein.

The sorting cell 212 includes a usage comparator 309. The usage comparator 309 is responsible for maintaining the usage spread across UEs, in order to provide for first order static mismatch shaping. Usage values associated with two previously prioritized UEs appear at the input of the sorting cell 212. The usage comparator 309 compares each of these usage values to V.

If a usage value 310 (labeled "usage A") associated with the higher priority input UE is less than V and a usage value 311 (labeled "usage B") associated with the lower priority input is greater than or equal to V, a usage decision output 312 of the usage comparator 309 is reset. The result in this case is to maintain the relative priorities of the first and second UEs.

On the other hand, if the usage value 311 is less than V and the usage value 310 is greater than or equal to V, the usage decision on the output 312 is set. The result in this case is to cause the relative priorities of the first and second UEs to be swapped. Finally, if the usage values 310, 311 associated with the input UEs are either both less than V or both greater than or equal to V, the "undecided" output 315 of the usage comparator 309 is set. The result in this case is to look at previous selection indicators associated with each of the UEs in order to make the swap decision.

The example sorting cell 212 also includes a usage selector 316 communicatively coupled to the usage comparator 309. The usage selector 316 is controlled by the "undecided" output 315 of the usage comparator 309. The usage selector 316 passes the usage decision if the usage values 310, 311 are not both less than V and are not both greater than or equal to V, (e.g., the "undecided" output of the usage comparator 309 is reset). The usage selector 316 enables previous selection logic 317 if the usage values 310, 311 associated with the first and second UEs, respectively, are either both less than V or both greater than or equal to V.

The example sorting cell 212 further includes a usage swap cell 318 communicatively coupled to the usage comparator 309. The usage swap cell 318 swaps a relative priority of the usage values 310, 311 associated with the first and second UEs, respectively, if the usage value 311 associated with the second UE is less than V and the usage value 310 associated with the first UE is equal to V.

The example sorting cell 212 further includes a previous selection swap cell 321 communicatively coupled to the usage comparator 309. The previous selection swap cell 321 receives a first previous selection indicator input 322 (labeled "previous selection A") and a second previous selection indicator input 323 (labeled "previous selection B") ordered according to a relative priority determined in a previous sampling operation. The first and second previous selection indicators on the inputs 322, 323 are swapped if the usage value 311 associated with the second UE is less than V and the usage value 310 associated with the first UE is greater than or equal to V.

The example sorting cell 212 also includes a previous selection comparator 333 communicatively coupled to the usage selector 316. The previous selection comparator 333 is responsible for reducing UE switching activity. The previous selection comparator 333 compares the state of the previous selection indicator input 322 associated with the first UE to the state of the previous selection indicator input 323 associated with the second UE if the usage values 310, 311 associated with the first and second UEs, respectively, are either both less than V or both greater than or equal to V.

The previous selection comparator 333 is configured to cause the relative priorities of the usage values 310, 311 and the previous selection indicator information at the inputs 322, 323 to be swapped if the usage values 310, 311 are either both less than V or both greater than or equal to V, the previous selection indicator input 323 associated with the second UE is set, and the previous selection indicator input 322 associated with the first UE is reset. In this case, the "decision" output 338 of the previous selection comparator 333 is set.

The previous selection comparator 333 is also configured to maintain the relative priorities of the usage values 310, 311 and the previous selection indicator information at the inputs 322, 323 if the usage values 310, 311 are either both less than V or both greater than or equal to V, the previous selection indicator input 323 is reset, and the previous selection indicator input 322 is set. In this case, the "decision" output 338 of the previous selection comparator 333 is reset.

The example sorting cell 212 also includes a previous selection selector 341 communicatively coupled to the previous selection comparator 333. The previous selection selector 341 is controlled by an "undecided" output 339 from the previous selection comparator 338. The "undecided" output 339 is set if the usage values 310, 311 are either both less than V or both greater than or equal to V and the previous selection indicator inputs 322, 323 are either both set or both reset. This case represents priority equivalence between the first and second UEs.

In some embodiments, the example sorting cell 212 includes a random bit generator 348 coupled to the previous selection selector 341. The previous selector 341 passes a random bit on an output 349 from the random bit generator 348. The random bit is used to "break the tie" represented by the priority equivalence between the first and second UEs. This mechanism operates to avoid output artifacts caused by repeating patterns that could otherwise result. The net effect of this condition is to cause the relative priorities of the usage values 310, 311 and the previous selection indicators at the inputs 322, 323 to be swapped if the usage values 310, 311 are either both less than V or both greater than or equal to V, the previous selection indicators at the inputs 322, 323 are either both set or both reset, and a randomly-generated sorting-stage dither bit is set.

Turning back to FIG. 1, V may be a constant (e.g., V=1; V=2; V=3, etc.). Additional levels of switching activity reduction may be achieved by increasing the value of V from V=1. However, increasing values of V result in a corresponding decrease in SNR at the converted output. Such SNR penalty may be acceptable, though, for higher signal levels in certain applications such as audio. The additional reduced distortion obtained with larger values of V may be a good trade-off for a lower SNR if the latter is masked by a higher signal level.

In some embodiments, V may be a variable determined by a usage spread parameter generator 130. The usage spread parameter generator 130 is communicatively coupled to the sorting network 112 and sets V proportional to a magnitude of a number to be converted 135. This mechanism may further reduce switching activity for cases in which a decrease in SNR associated with an increased V is likely to be masked by a larger magnitude of an analog signal resulting from the conversion. Although V has heretofore been described as a quantity not to be exceeded, it is noted that certain previously-described sorting cell inputs may temporarily exceeded V following a dynamic reduction of V.

The DEM apparatus 100; the usage module 106; the differential counters 107; the register 109; the sorting network 112; the selection logic 114; the vector quantizer 125; the sorting cells 209, 212; the order of preference 213; the swap cells 218, 318, 321; the converter code 142; the UE selection vector 118; the comparators 309, 333; the usage values 310, 311; the outputs 108, 110, 215, 312, 315, 338, 339; the selectors 316, 341; the previous selection logic 317; the indicator 210; the indicator inputs 322, 323; the random bit generator 348; and the number to be converted 135; may all be characterized as "modules" herein.

The modules may include hardware circuitry, optical components, single or multi-processor circuits, memory circuits, and/or computer instructions encoded in a computer-readable medium and capable of being executed by a processor (excluding non-functional descriptive matter), firmware, and combinations thereof, as desired by the architect of the reduced-switching DEM apparatus 100 and as appropriate for particular implementations of various embodiments.

The apparatus and systems described herein may be useful in applications other than ADC or DAC converters. The illustration of the reduced-switching DEM apparatus 100 is intended to provide a general understanding of the structure of various embodiments. It is not intended to serve as a complete description of all the elements and features of apparatus and systems that might make use of the structures described herein.

The various embodiments may be incorporated into electronic circuitry used in computers, communication and signal processing circuitry, single-processor or multi-processor modules, single or multiple embedded processors, multi-core processors, data switches, and application-specific modules including multilayer, multi-chip modules, among others. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may also include one or more methods.

Figure 4A:
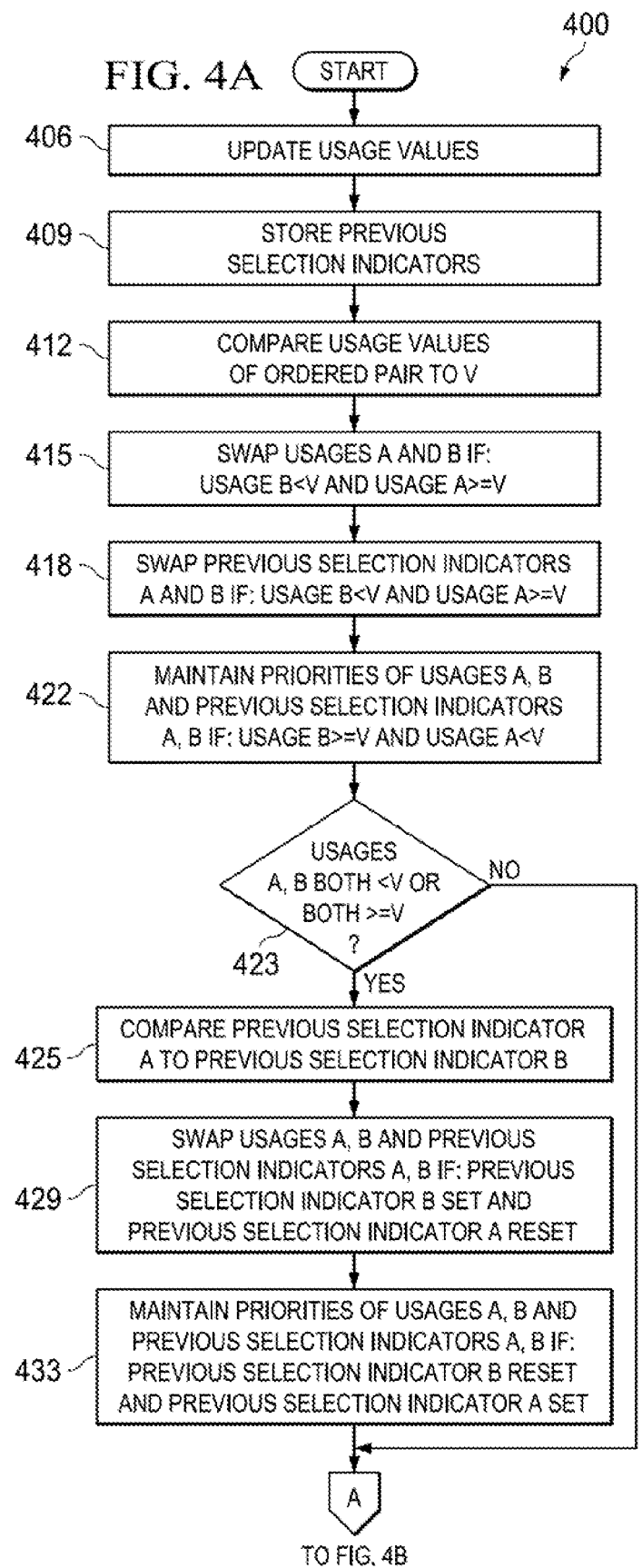
FIGS. 4A and 4B are flow diagrams illustrating an example method according to various embodiments.
Figure 4B:
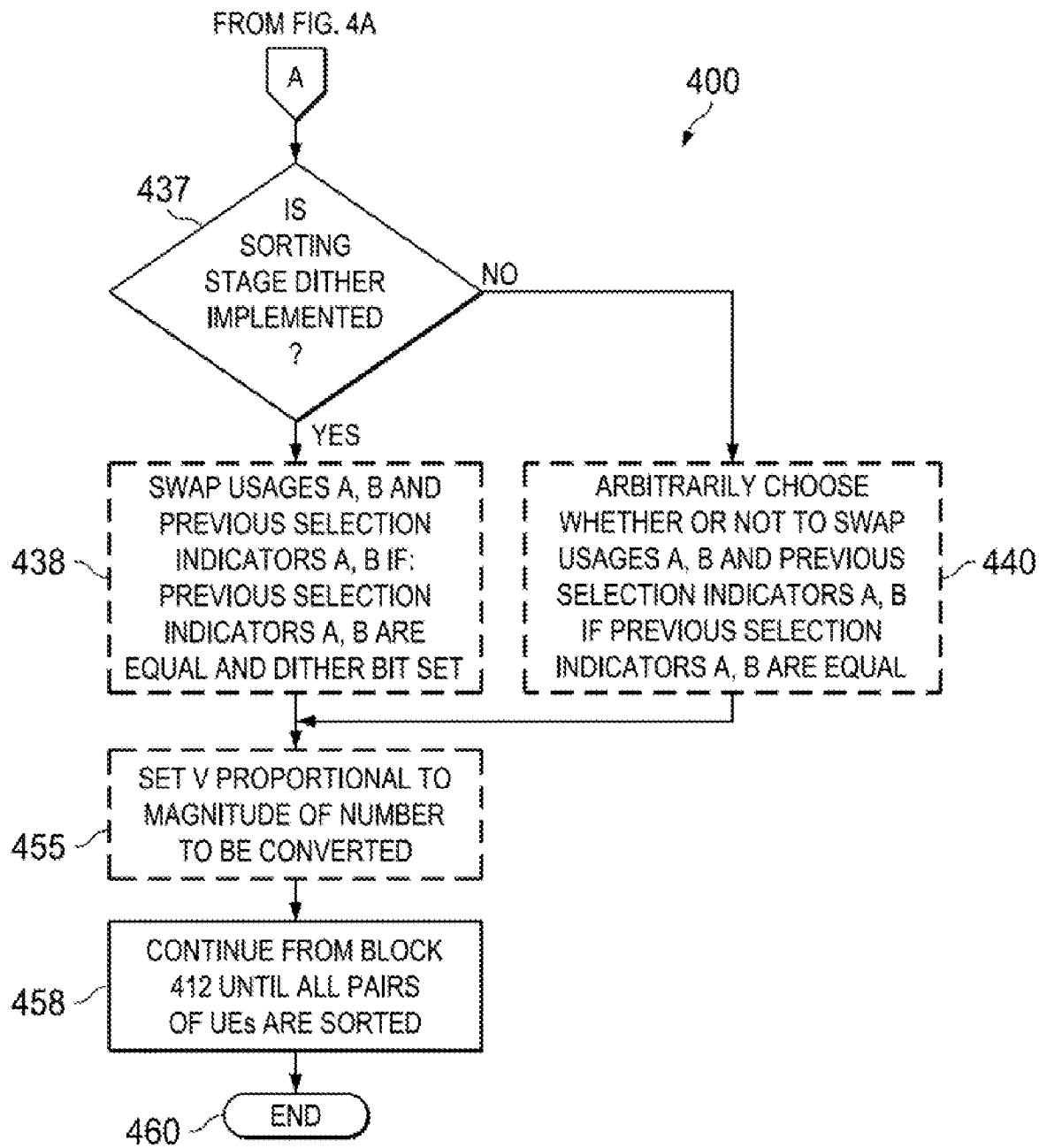

FIGS. 4A, 4B are flow diagrams illustrating an example method 400 according to various embodiments. The method 400 sorts a set of UEs in a converter such as an ADC or DAC in order to reduce switching artifacts associated with DEM operations. The method 400 establishes a priority order of selection of a subset of the set of UEs to use in a next single-sample integration operation. The method 400 operates to demote the priority of a UE during sorting if a usage value associated with the UE is greater than or equal to a maximum allowable usage parameter value, V. In contrast, the UE is promoted during sorting if the usage value associated with the UE is less than V and the UE was used in an immediately previous single-sample integration operation.

More specifically, the method 400 performs a cascaded series of sorting cell operations on usage values and previous selection indicators associated with the set of UEs using a sorting network. The method 400 uses the results from the sorting cell operations to perform a cascaded series of swap cell decisions. The swap cell decisions operate on bits associated with a current converter code to obtain a UE selection vector. Each swap cell decision is controlled by a swap decision associated with a corresponding sorting cell of the sorting network, as further described below.

The method 400 commences at block 406 with updating a usage value for each UE of the set of UEs. The usage value represents a differential count of prior instances of use of the UE compared to prior instances of use of others of the set of UEs during a multi-sample integration period. The usage value update is achieved by performing the following operations on the set of UEs. For each UE, a usage value corresponding to the UE is incremented by one if the UE was selected during the immediately-prior integration operation, unless such procedure would cause all of the usage values to be greater than zero. In the latter case, each usage value is decremented by one if the corresponding UE was not selected during the immediately-prior integration operation. Note that this is equivalent to incrementing each usage value by one if the corresponding UE was selected for use in the immediately-prior integration operation followed by decrementing all of the usage values by one if they are all greater than zero. This usage update procedure prevents the usage values from growing without limit and overflowing usage value storage capacity. It is noted, however, that it is the differential count of prior instances of use of each UE that is used in these embodiments. Other methods of updating usage values may achieve a similar result, and are thus incorporated herein.

The method 400 continues at block 409 with storing a previous selection indicator for each UE of the set of UEs. The previous selection indicator tracks whether a UE was selected for use in an immediately previous single-sample integration operation.

The example method 400 includes performing a set of operations on each pair of an ordered set of pairs of UEs. UEs of an example pair of UEs for which operations are described below are denoted as "first UE" and "second UE." It is noted that other embodiments may achieve the same result as the example method 400 by performing similar operations on subsets of the set of UEs larger than two.

The method 400 includes comparing usage values associated with the first and second UEs of the set of UEs to V, at block 412. The method 400 also includes swapping a relative priority of the usage value associated with the first UE and the usage value associated with the second UE if the usage value associated with the second UE is less than V and the usage value associated with the first UE is greater than or equal to V, at block at block 415.

The method 400 further includes swapping a relative priority of a previous selection indicator associated with the first UE and a previous selection indicator associated with the second UE if the usage value associated with the second UE is less than V and the usage value associated with the first UE is greater than or equal to V, at block 418. The method 400 additionally includes maintaining the relative priorities of the usage values and the previous selection indicators associated with the first and second UEs, respectively, if the usage value associated with the second UE is greater than or equal to V and the usage value associated with the first UE is less than V, at block 422.

The method 400 includes determining whether the usage values associated with the first and second UEs are either both less than V or both greater than or equal to V, at block 423. If not, the method 400 continues at block 437 of FIG. 4B, as further described below. If both usage values are either less than V or greater than or equal to V, the method 400 includes comparing a previous selection indicator associated with a first UE of the set of UEs to a previous selection indicator associated with a second UE of the set of UEs, at block 425.

The method 400 continues at block 429 with swapping relative priorities of the usage values and the previous selection indicators associated with the first and second UEs, respectively, if the previous selection indicator associated with the second UE is set and the previous selection indicator associated with the first UE is reset.

The method 400 includes maintaining the relative priorities of the usage values and the previous selection indicators associated with the first and second UEs, respectively, if the previous selection indicator associated with the second UE is reset and the previous selection indicator associated with the first UE is set, at block 433.

Turning to FIG. 4B, the method 400 may, in some embodiments, determine whether sorting stage dither is implemented, at block 437. If so, and if the previous selection indicators associated with the first and second UEs are both either set or reset and a randomly-generated sorting-stage dither bit is set, the method 400 may swap the relative priorities of the usage values and the previous selection indicators associated with the first and second UEs, respectively, at block 438.

If sorting stage dither is not implemented, the method 400 may arbitrarily choose whether or not to swap the relative priorities of the usage values and the previous selection indicators associated with the first and second UEs, respectively, if the previous selection indicators associated with the first and second UEs are both either set or reset, at block 440. The arbitrary decision whether or not to swap may be made as a design-dependent implementation.

In some embodiments, the method 400 may optionally include, for each conversion, setting V proportional to a magnitude of a current number to be converted in order to further reduce switching activity, at block 455.

At block 458, the method 400 returns to block 412 and continues until all pairs of UEs are sorted. The method 400 then terminates at block 460. It is noted that the activities described herein may be executed in an order other than the order described. The various activities described with respect to the methods identified herein may also be executed in repetitive, serial, and/or parallel fashion.

The apparatus and methods described herein operate to reduce switching noise and distortion by disallowing switching in certain instances, while maintaining established limits on a maximum usage spread. Reduced levels of deleterious artifacts at the output of converters and other circuitry may be achieved as a result.

By way of illustration and not of limitation, the accompanying figures show specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the preceding Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A reduced-switching dynamic element matching (DEM) apparatus, comprising:
    a usage module to store a usage value for each unit element (UE) of a set of UEs associated with a converter;
    a previous selection register to store a previous selection indicator for each UE of the set of UEs to track whether the UE was selected for use in an immediately previous single-sample integration operation; and
    a sorting network communicatively coupled to the usage module and to the previous selection register to sort the set of UEs based upon the usage values, the previous selection indicators, and a maximum allowable usage spread parameter value, the sorting network to establish a priority order of selection of a subset of the set of UEs to use in a next single-sample integration operation.

2. The reduced-switching DEM apparatus of claim 1, the usage module comprising a set of differential counters, each counter to store the usage value for each UE of the set of UEs, the usage value representing a count of prior instances of use of the UE adjusted to prevent the usage value from growing without limit.

3. The reduced-switching DEM apparatus of claim 1, the sorting network comprising a cascaded series of cross-linked sorting cells to perform comparator operations on the usage values and the previous selection indicators associated with the set of UEs, each sorting cell to decide whether to swap a relative priority associated with usage values and previous selection indicators based upon the usage values, the previous selection indicators, and the maximum allowable usage spread parameter value.

4. The reduced-switching DEM apparatus of claim 3, each sorting cell structured to receive usage values and previous selection indicators corresponding to an ordered pair of UEs.

5. The reduced-switching DEM apparatus of claim 3, each sorting cell comprising:
    a usage comparator to compare usage values associated with a first and second UE of the set of UEs to a maximum allowable usage spread parameter value;
    a usage swap cell communicatively coupled to the usage comparator to swap a relative priority of the usage value associated with the first UE and the usage value associated with the second UE if the usage value associated with the second UE is less than the maximum allowable usage spread parameter value and the usage value associated with the first UE is greater than or equal to the maximum allowable usage spread parameter value; and
    a previous selection swap cell communicatively coupled to the usage comparator to swap a relative priority of a previous selection indicator associated with the first UE and a previous selection indicator associated with the second UE if the usage value associated with the second UE is less than the maximum allowable usage spread parameter value and the usage value associated with the first UE is greater than or equal to the maximum allowable usage spread parameter value.

6. The reduced-switching DEM apparatus of claim 5, the usage comparator configured to maintain the relative priorities of the usage values and the previous selection indicators associated with the first and second UEs, respectively, if the usage value associated with the second UE is greater than or equal to the maximum allowable usage spread parameter value and the usage value associated with the first UE is less than the maximum allowable usage spread parameter value.

7. The reduced-switching DEM apparatus of claim 5, further comprising:
    a usage selector communicatively coupled to the usage comparator to enable previous selection logic if the usage values associated with the first and second UEs are either both less than the maximum allowable usage spread parameter value or both greater than or equal to the maximum allowable usage spread parameter value;
    a previous selection comparator communicatively coupled to the usage selector to compare the previous selection indicator associated with the first UE to the previous selection indicator associated with the second UE if the usage values associated with the first and second UEs are either both less than the maximum allowable usage spread parameter value or both greater than or equal to the maximum allowable usage spread parameter value; and
    a previous selection selector communicatively coupled to the previous selection comparator to cause the relative priorities of the usage values and the previous selection indicators associated with the first and second UEs, respectively, to be swapped if the usage values associated with the first and second UEs are either both less than the maximum allowable usage spread parameter value or both greater than or equal to the maximum allowable usage spread parameter value, the previous selection indicators associated with the first and second UEs are either both set or both reset, and a randomly-generated sorting-stage dither bit is set.

8. The reduced-switching DEM apparatus of claim 7, the previous selection comparator configured to cause the relative priorities of the usage values and the previous selection indicators associated with the first and second UEs, respectively, to be swapped if the usage values associated with the first and second UEs are either both less than the maximum allowable usage spread parameter value or both greater than or equal to the maximum allowable usage spread parameter value, the previous selection indicator associated with the second UE is set, and the previous selection indicator associated with the first UE is reset.

9. The reduced-switching DEM apparatus of claim 7, the previous selection comparator configured to maintain the relative priorities of the usage values and the previous selection indicators associated with the first and second UEs, respectively, if the usage values associated with the first and second UEs are either both less than the maximum allowable usage spread parameter value or both greater than or equal to the maximum allowable usage spread parameter value, the previous selection indicator associated with the second UE is reset, and the previous selection indicator associated with the first UE is set.

10. The reduced-switching DEM apparatus of claim 1, further comprising:
a UE selection network communicatively coupled to the sorting network to perform a cascaded series of swap cell decisions on bits associated with a current converter code to obtain a UE selection vector, each swap cell decision controlled by a swap decision associated with a corresponding sorting cell of the sorting network.

11. The reduced-switching DEM apparatus of claim 1, further comprising:
a usage spread parameter generator communicatively coupled to the sorting network to set the maximum allowable usage spread parameter value proportional to a magnitude of a number to be converted in order to further reduce switching activity.

12. A method of reducing switching artifacts associated with dynamic element matching (DEM), comprising:
sorting a set of unit elements (UEs) to establish a priority order of selection of a subset of the set of UEs to use in a next single-sample integration operation, including:
demoting a UE during the sorting if a usage value associated with the UE is greater than or equal to a maximum allowable usage spread parameter value; and
promoting the UE during the sorting if the usage value associated with the UE is less than the maximum allowable usage spread parameter value and the UE was used in an immediately previous single-sample integration operation.

13. The method of claim 12, further comprising:
storing a usage value for each UE of the set of UEs, the usage value representing a differential count of prior instances of use of the UE compared to prior instances of use of others of the set of UEs during a multi-sample integration period; and
storing a previous selection indicator for each UE of the set of UEs to track whether the UE was selected for use in an immediately previous single-sample integration operation.

14. The method of claim 13, further comprising:
performing a cascaded series of sorting cell operations on the usage values and the previous selection indicators associated with the set of UEs using a sorting network to obtain a selection preference vector representing the priority order of selection of the subset of UEs to be used in the next single-sample integration operation.

15. The method of claim 14, each sorting cell operation comprising:
comparing usage values associated with a first and second UE of the set of UEs to the maximum allowable usage spread parameter value;
swapping a relative priority of the usage value associated with the first UE and the usage value associated with the second UE if the usage value associated with the second UE is less than the maximum allowable usage spread parameter value and the usage value associated with the first UE is greater than or equal to the maximum allowable usage spread parameter value;
swapping a relative priority of a previous selection indicator associated with the first UE and a previous selection indicator associated with the second UE if the usage value associated with the second UE is less than the maximum allowable usage spread parameter value and the usage value associated with the first UE is greater than or equal to the maximum allowable usage spread parameter value; and
maintaining the relative priorities of the usage values and the previous selection indicators associated with the first and second UEs, respectively, if the usage value associated with the second UE is greater than or equal to the maximum allowable usage spread parameter value and the usage value associated with the first UE is less than the maximum allowable usage spread parameter value.

16. The method of claim 14, each sorting cell operation comprising:
comparing a previous selection indicator associated with a first UE of the set of UEs to a previous selection indicator associated with a second UE of the set of UEs if usage values associated with the first and second UEs are either both less than the maximum allowable usage spread parameter value or both greater than or equal to the maximum allowable usage spread parameter value;
swapping relative priorities of the usage values and the previous selection indicators associated with the first and second UEs, respectively, if the usage values associated with the first and second UEs are either both less than the maximum allowable usage spread parameter value or both greater than or equal to the maximum allowable usage spread parameter value, the previous selection indicator associated with the second UE is set, and the previous selection indicator associated with the first UE is reset;
maintaining the relative priorities of the usage values and the previous selection indicators associated with the first and second UEs, respectively, if the usage values associated with the first and second UEs are either both less than the maximum allowable usage spread parameter value or both greater than or equal to the maximum allowable usage spread parameter value, the previous selection indicator associated with the second UE is reset, and the previous selection indicator associated with the first UE is set; and
swapping the relative priorities of the usage values and the previous selection indicators associated with the first and second UEs, respectively, if the usage values associated with the first and second UEs are either both less than the maximum allowable usage spread parameter value or both greater than or equal to the maximum allowable usage spread parameter value, the previous selection indicators associated with the first and second UEs are either both set or both reset, and a randomly-generated sorting-stage dither bit is set.

17. The method of claim 14, further comprising:

at a UE selection network, performing a cascaded series of swap cell decisions on bits associated with a current converter code to obtain a UE selection vector, each swap cell decision controlled by swap decisions associated with a corresponding sorting cell of the sorting network.

18. The method of claim 12, further comprising:

setting the maximum allowable usage spread parameter value proportional to a magnitude of a current number to be converted in order to further reduce switching activity.

19. A reduced-switching dynamic element matching (DEM) apparatus, comprising:

a set of differential counters, each counter to store a count of prior instances of use of each unit element (UE) of a set of UEs associated with an analog-to-digital converter;

a previous selection register to store a previous selection indicator for each UE of the set of UEs to track whether the UE was selected for use in an immediately previous single-sample integration operation; and a cascaded series of cross-linked sorting cells associated with each pair of paired sets of the differential counters and corresponding previous selection indicators, the series of sorting cells coupled to the set of differential counters and to the previous selection register to perform comparator operations on the counts of prior instances of use and the previous selection indicators, each sorting cell to decide whether to swap a relative priority of the counts of prior instances of use and previous selection indicators based upon the count of prior instances of use, a state of the previous selection indicators, and a maximum allowable usage spread parameter value, the cross-lined sorting cells to establish a priority order of selection of a subset of the set of UEs to use in a next single-sample integration operation.

20. The reduced-switching DEM apparatus of claim 19, each sorting cell comprising:

a usage comparator to compare usage values associated with a first and second UE of the set of UEs to a maximum allowable usage spread parameter value;

a usage swap cell communicatively coupled to the usage comparator to swap a relative priority of the usage value associated with the first UE and the usage value associated with the second UE if the usage value associated with the second UE is less than the maximum allowable usage spread parameter value and the usage value associated with the first UE is greater than or equal to the maximum allowable usage spread parameter value; and a previous selection swap cell communicatively coupled to the usage comparator to swap a relative priority of a previous selection indicator associated with the first UE and a previous selection indicator associated with the second UE if the usage value associated with the second UE is less than the maximum allowable usage spread parameter value and the usage value associated with the first UE is greater than or equal to the maximum allowable usage spread parameter value.

* * * * *